(12) United States Patent
Van Zwet et al.

(10) Patent No.: US 8,925,186 B2
(45) Date of Patent: Jan. 6, 2015

(54) SYSTEM AND METHOD FOR PICKING AND PLACEMENT OF CHIP DIES

(75) Inventors: Erwin John Van Zwet, Pijnacker (NL); Léon Van Dooren, Delft (NL); Adrianus Johannes Petrus Maria Vermeer, Geldrop (NL); Kees Moddemeijer, Leiden (NL)

(73) Assignee: Nederlandse Organisatie voor Toegepast-Natuurwetenschappelijk Onderzoek TNO, Delft (NL)

( * ) Notice: Subject to any disclaimer, the term of this patent is extended or adjusted under 35 U.S.C. 154(b) by 179 days.

(21) Appl. No.: 13/520,674

(22) PCT Filed: Jan. 6, 2011

(86) PCT No.: PCT/NL2011/050010
§ 371 (c)(1),
(2), (4) Date: Sep. 4, 2012

(87) PCT Pub. No.: WO2011/084058
PCT Pub. Date: Jul. 14, 2011

(65) Prior Publication Data
US 2013/0004269 A1    Jan. 3, 2013

(30) Foreign Application Priority Data

Jan. 7, 2010 (EP) ..................... 10150279

(51) Int. Cl.
*B23P 19/00* (2006.01)
*B25J 9/16* (2006.01)
*G05B 19/401* (2006.01)
*H01L 21/68* (2006.01)

(52) U.S. Cl.
CPC ............. *B25J 9/1697* (2013.01); *G05B 19/401* (2013.01); *G05B 2219/40609* (2013.01); *G05B 2219/45029* (2013.01); *H01L 21/681* (2013.01)
USPC ..................... 29/739; 29/740; 29/720; 29/721

(58) Field of Classification Search
CPC .. H05K 13/0413; H05K 13/08; H01L 21/681; H01L 21/67144
USPC ........... 29/705, 719–721, 740–743, 833–834; 414/737, 222.02; 382/141, 144–153; 438/16–20
See application file for complete search history.

(56) References Cited

U.S. PATENT DOCUMENTS

| 5,225,026 A | 7/1993 | Ozawa et al. |
| 5,701,661 A | 12/1997 | van den Brink |

(Continued)

FOREIGN PATENT DOCUMENTS

| CN | 1738526 A1 | 2/2006 |
| EP | 0476851 A2 | 3/1992 |

(Continued)

*Primary Examiner* — Minh Trinh
(74) *Attorney, Agent, or Firm* — Hoffmann & Baron, LLP

(57) ABSTRACT

According to an aspect of the invention, there is provided a chip die 2 manipulator apparatus arranged for picking and placing of a chip die 2 in a chip manufacturing process, wherein an imaging system 11 comprising an arc form convex spherical mirror 13 arranged at a second off-axis position B and centered relative to the center position 5; a folding mirror 4 arranged in a light path between the convex spherical mirror 13 and the center position 5 for folding the light path to a third off-axis position C; and an arc form concave spherical mirror 15 arranged at the third off-axis position C having a curvature to image from at least one of the center position 5 and the component 2 on the image detection system 9. The imaging system 11 corrects for the angled image detection of the center position 5.

5 Claims, 3 Drawing Sheets

(56) References Cited

U.S. PATENT DOCUMENTS

| | | | |
|---|---|---|---|
| 6,807,725 B2 * | 10/2004 | Asai et al. | 29/740 |
| 7,239,399 B2 * | 7/2007 | Duquette et al. | 356/614 |
| 7,559,134 B2 * | 7/2009 | Gaida | 29/720 |
| 7,706,595 B2 * | 4/2010 | Bushman et al. | 382/141 |
| 7,716,822 B2 * | 5/2010 | Smeets et al. | 29/832 |
| 7,941,913 B2 * | 5/2011 | Horijon | 29/739 |
| 8,540,001 B2 * | 9/2013 | Kihara et al. | 156/362 |
| 2004/0075918 A1 | 4/2004 | Bendat et al. | |
| 2013/0004269 A1 * | 1/2013 | Van Zwet et al. | 414/222.02 |

FOREIGN PATENT DOCUMENTS

| | | |
|---|---|---|
| EP | 0691805 A1 | 1/1996 |
| JP | 4275835 | 10/1992 |
| JP | 2007103667 | 4/2007 |
| WO | 0167831 A2 | 9/2001 |
| WO | WO 03/043400 A1 | 5/2003 |

* cited by examiner

SYSTEM AND METHOD FOR PICKING AND PLACEMENT OF CHIP DIES

CROSS-REFERENCE TO RELATED APPLICATIONS

This Application is the U.S. National Phase of, and Applicants claim priority from, International Application Number PCT/NL2011/050010 filed Jan. 6, 2011 and European patent Application Number EP 10150279.7 filed Jan. 7, 2010, each of which are incorporated herein by reference.

FIELD OF THE INVENTION

The invention relates to a manipulator apparatus arranged for picking and placing of a component in a component assembly process.

BACKGROUND OF THE INVENTION

An example of component placement is in the field of die placement. In current die-bond equipment that is designed for fast (order die/second) and accurate (order 10 micron) placement of dies on a substrate the accuracy depends on a lot of machine parameters. The strategy for reaching an accurate placement is generally as follows:

1. A bond head consists of a camera looking downward (to view the substrate) and a pick-up tool.
2. Pick a die from a donor substrate (e.g. wafer).
3. Move the die to an upward looking camera to measure the orientation of the die with respect to the pick-up tool, and correct any misalignment.
4. Move the bond head to the placement position on the substrate. Use the image of the camera to get position information of the bond head.
5. Move the bond head to position the die above the placement position.
6. Place the die.

Step 5 is required as the tool and the camera cannot be in the same position on the bond head. So after measuring the placement position, a step is required during and after which no verification of the position is possible. This 'blind' step is about 5 to 10 cm long, based on the size of the camera unit and the tool. The accuracy of this blind step depends on the accuracy of the bearings and metrology and requires a complex calibration scheme. So in practice the overall placement accuracy may still be too low. A need arises to further reduce the placement error.

SUMMARY OF THE INVENTION

According to an aspect of the invention, there is provided a manipulator apparatus arranged for picking and placing of a component in a component assembly process, comprising: a Z-stroke arranged for component placement along a Z-axis relative to a placement position on a substrate; an actuation system arranged for aligning the component relative to the placement position; a pickup head arranged on the Z-stroke to pick up a component and place it on the placement position; and an alignment system coupled to the actuation system; wherein the alignment system comprises: an image detection system arranged on a first off-axis position (A, in FIG. 2) arranged for receiving light from the component. The alignment system further comprises an imaging system comprising an arc form concave spherical mirror arranged at a second off-axis position (B); a folding mirror arranged in a light path for folding the light to a third off-axis position (C); and an arc form convex spherical mirror arranged at the third off-axis position (C) having a curvature to image the component on the image detection system. The imaging system corrects for the angled image detection. As a result the complete field of view of the component will be in focus on the image detection system.

The optics used for imaging the component can also be used for illumination of the component by replacing the camera with a light source, or coupling in the light with a beam splitter.

DETAILED DESCRIPTION

Figure 1:
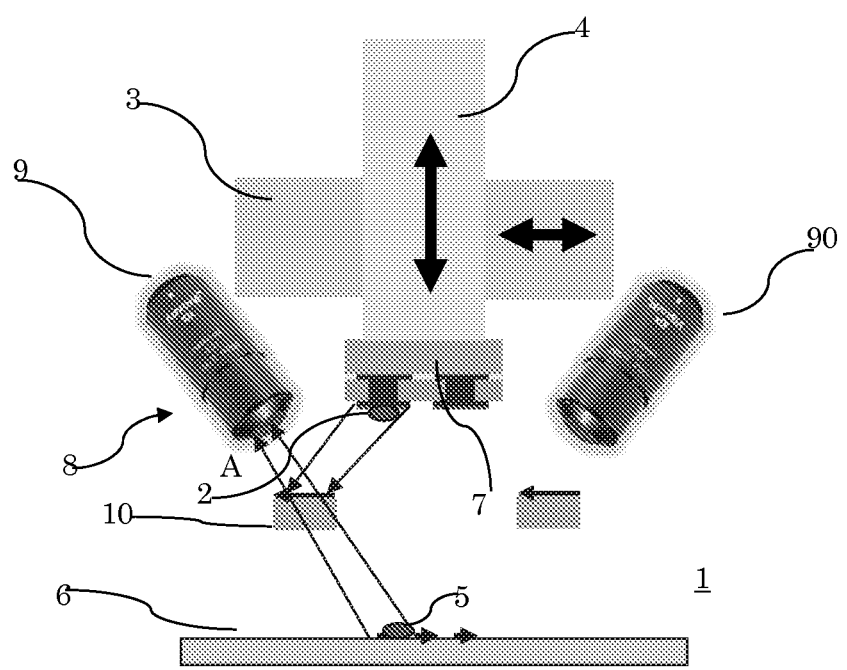
FIG. 1 shows a schematic of the image detection system in the machine setup.

Turning to FIG. 1, a chip die manipulator apparatus 1, in the art known as 'bond head' with an optical system for providing collocated vision of the die 2 and the substrate 6, and placement at the same location is proposed.

With this system, the placement position 5 can be measured with the die 2 already at the required placement position. With an optical system that is capable of looking underneath the die, the above mentioned blind step 5 can be eliminated. It is more or less an 'aim and shoot' principle, wherein, after the detection, no additional XY movement with the actuator 3 is necessary. The only movement left is for the actual placement using the Z-stroke 4. This movement can be done on mechanical repeatability. Therefore, the placement accuracy does no longer depend on the accuracy of the mechanics. It is noted that CN1738526 discloses a fixed camera arrangement that, via a semi-transparent mirror, simultaneously images a die and a placement position on the substrate under an angle. However, the angled camera position involves depth of focus requirements that cannot be solved easily. In addition, the disclosed simultaneous camera registration in the said publication of the die and placement position still induces placement errors that are considered too high.

Accordingly, machine accuracy can be eliminated from the placement accuracy so that the system can be scaled towards higher accuracy by choosing a more accurate vision sensor. In addition, the calibration effort is reduced compared to non collocated measurement systems. FIG. 1 shows one configuration of a co-axial vision system. The image detection system 9 is positioned under an angle with the tool. By using a semi-transparent mirror 10 or beam splitter cube one camera can be used to look at both the top of the substrate 6 and the bottom of the die. To reduce cross talk between the two views, a shutter can be added to switch between the substrate and the die view. However, it is also possible to use separate alignment systems to image the placement position 5 and the die 2. In addition, a second camera 90 can be added to increase the accuracy of the rotation measurement around the vertical Z-axis, when the die size is much larger than the field of view of the camera. Accordingly, there is disclosed a manipulator apparatus 1 arranged for picking and placing of a component in a component assembly process, comprising: a Z-stroke 4 arranged for placement along a Z-axis relative to a placement position 5 on a substrate 6; an actuation system 3 arranged for aligning the component 2 relative to the placement position 5; a pickup head 7 arranged on the Z-stroke 4 to pick up a component 2 and place it on the placement position 5; and an alignment system 8 coupled to the actuation system 3; wherein the alignment system 8 comprises: an image detection system 9 arranged on a first off-axis position A and receiving light from the placement position 5. The actuation system can in principle use any coordinate reference and is generally designed for motion in a plane normal to the Z-axis. One example is an XY actuator, controlling XY and R(XYZ) motion in a frame of reference where a linear Z-stroke defines a Z-direction.

The setup enables alignment of the die with the substrate 6, without the need for further motion in the substrate 6 plane during the place action. The only required motion in the placement of the die on the substrate 6 is the Z-movement. This Z-movement can be calibrated, for example by performing a dummy placement above a transparent substrate 6. Such a transparent substrate 6, with reference markers, allows the verification of the actual placement by using a camera underneath. The transparent substrate can be placed at a dedicated position in the machine, allowing to do the verification measurement in between the regular die placements. Based on this calibration the exact location above the real substrate 6 can be calculated. By using a second Z-stroke, the Z-position of the placing action can be changed on the local height of the substrate 6 with the second Z actuator, without changing the mechanical Z-position of the placement stroke of the Z-actuator 4. In addition, any of these Z-actuators can be used for focusing the image on the image detector.

Figure 2:
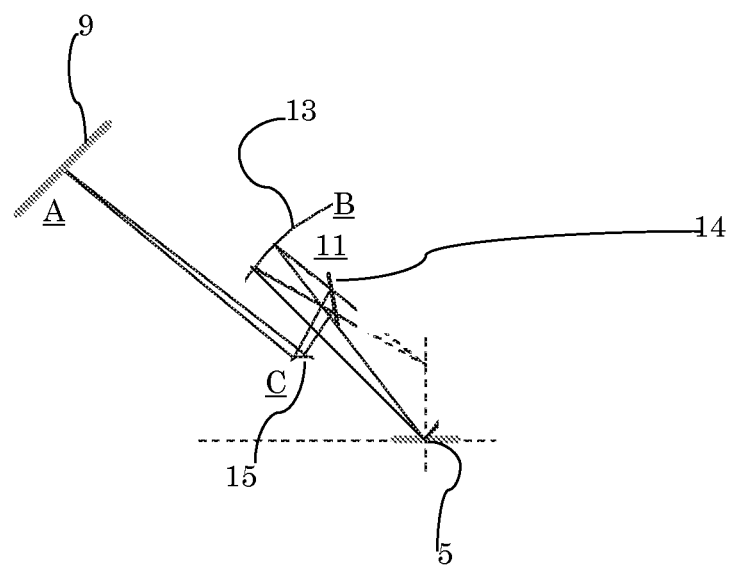
FIG. 2 shows a detailed view of an embodiment of the imaging system referenced in FIG. 1.

FIG. 2 gives a further detail of the alignment system 8 referenced in FIG. 1. The system 8 includes an imaging system 11 involving a Schwarzschild magnifying objective that is modified to image an object plane under an angle. According to an aspect of the invention, the imaging system 11 comprises an arc form concave spherical mirror 13 arranged at a second off-axis position B and a folding mirror 14 for folding the light path to a third off-axis position C; and an arc form convex spherical mirror 15 arranged at the third off-axis position C having a curvature to image the centre position 5 on the image detection system 9.

The inspection under an angle results in a shift of the image as function of the focus distance. Therefore repeatability of the focusing distance is important. Focusing repeatability can be accomplished in several ways:

1. Focusing on image contrast, requiring a small focal depth (high NA)
2. Triangulation by projecting one or more (laser) spots, lines or other patterns on the die and substrate.
3. Triangulation by looking with two or more cameras to the same area on the die and substrate
4. Pupil masking
5. Interferometric techniques
6. Confocal techniques As mentioned before, a second camera 90 can be used to increase the rotation accuracy in case the size of the die is larger than the field of view of the camera. In practice however only one camera can be placed with high repeatability at the same focus distance. The fluctuation in the focus distance of a second camera 90 leads to an increased measurement error in one direction. This still allows the accurate position measurement perpendicular to this direction. The two cameras together will result in the measurement of three parameters, just enough to measure the lateral position and the rotation around the vertical axis.

While in principle, the arc form may extend completely around the Z-axis, a compact design of the chip die 2 manipulator apparatus 1 is obtained by an arc form of a semi-circular segment.

Figure 3:
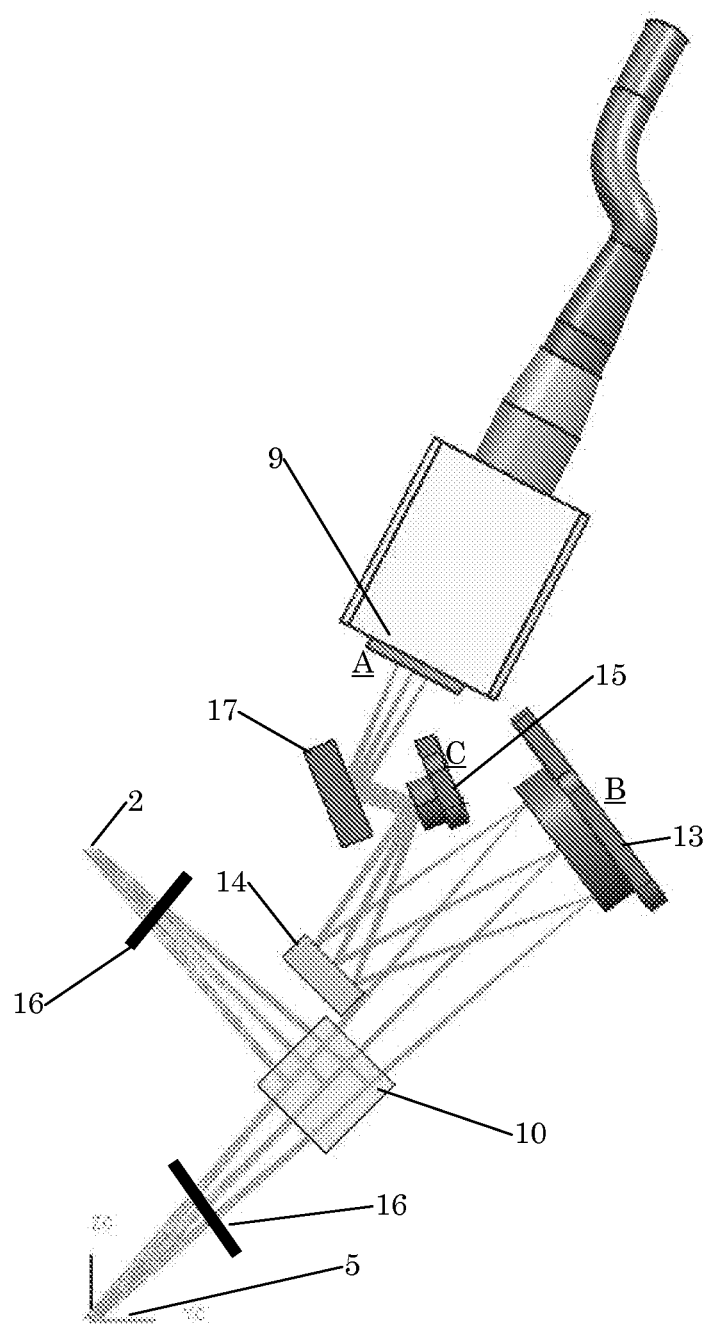
FIG. 3 shows an embodiment according to another aspect.

FIG. 3 shows an embodiment having a second folding mirror 17 to compactify the design. In addition, a semi-transparent mirror 10 is arranged in a light path between the image detection system 9 and the placement position 5, so that the placement position 5 and the component 2 are imaged substantially coinciding in the image detection system 9. Conveniently, the component 2 is brought into focus by Z-actuation of the Z-stroke 4. In addition, to further enhance the performance of the system, the die and the substrate location are imaged preferably separately. To this end, in the light path to the centre position 5 a shutter 16 may be provided and in the light path to the die a shutter 16 may be provided.

In use, the operation of the manipulator apparatus may be as follows:

1. Pick a die from a donor substrate (e.g. wafer).
2. If no calibration is required, continue with step 11
3. Bring the die into focus with the Z stroke that will be used on reproducibility only
4. Measure the position and orientation of the die with the image detection system.
5. Move the die to the calibration substrate
6. Bring the substrate into focus with the other Z stroke
7. Measure the position and orientation of the calibration substrate with the image detection system
8. Place the die on the calibration substrate with the Z stroke that will be used on reproducibility only.
9. Measure with the camera under the calibration substrate the result of the placement and calculate the required correction values for future placements.
10. Lift up the die from the calibration substrate
11. Measure the position and orientation of the die with the image detection system.
12. Move the die to the placement position on the substrate
13. Bring the substrate into focus with the other Z stroke
14. Measure the position and orientation of the substrate with the image detection system
15. If necessary adjust the position or orientation of the die by means of the X, Y and rotation actuators
16. Place the die on the substrate with the Z stroke that will be used on reproducibility only.

While the invention has been illustrated and described in detail in the drawings and foregoing description, such illustration and description are to be considered illustrative or exemplary and not restrictive; the invention is not limited to the disclosed embodiments. In particular, while the embodiments disclosed show a folding mirror having no optical power, embodiments comprising a folding mirror having an optical power are deemed to fall within the scope of the present invention. In addition, the components in the disclosed examples are dies in a die placement process, other placement systems which require high accuracy, such as surface mounted devices, MEMS devices etc. can be placed without departing from the scope of the invention. Other variations to the disclosed embodiments can be understood and by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. A component manipulator apparatus arranged for picking and placing of a component in a component assembly process, comprising:
   a Z-stroke arranged for component placement along a Z-axis relative to a placement position on a substrate;
   an actuation system arranged for aligning the component relative to the placement position;
   a pickup head arranged on the Z-stroke to pick up a component and place it on the placement position; and
   an alignment system coupled to the actuation system; wherein
   the alignment system comprises:
      an image detection system arranged on a first off-axis position (A) and arranged for receiving light from the placement position and the component; and
      an imaging system comprising an arc form concave spherical mirror arranged at a second off-axis position (B) and centered relative to the placement position; a folding mirror arranged in a light path between the concave spherical mirror and the placement position for folding the light path to a third off-axis position (C); and an arc form convex spherical mirror arranged at the third off-axis position (C) having a curvature to image the placement position and the component on the image detection system.

2. The component manipulator apparatus according to claim 1, wherein the arc form of the concave spherical mirror and the concave spherical mirror, is semi-circular.

3. The component manipulator apparatus according to claim 1, further comprising a semi-transparent mirror or beamsplitter cube, arranged in a light path between the image detection system and the placement position, so that the placement position and the component are imaged as substantially coinciding in the image detection system.

4. The component manipulator apparatus according to claim 1, wherein a shutter is included in the light path to a center of the placement position.

5. The component manipulator apparatus according to claim 1, wherein a shutter is included in the light path to the component, the component including a die.

* * * * *